US006999738B2

(12) United States Patent
Gerhaeuser et al.

(10) Patent No.: US 6,999,738 B2
(45) Date of Patent: Feb. 14, 2006

(54) DEVICE AND METHOD FOR PRE-TREATING A SIGNAL TO BE TRANSMITTED USING A NON-LINEAR AMPLIFIER WITH AN UPSTREAM BAND-PASS FILTER

(75) Inventors: Heinz Gerhaeuser, Waischenfeld (DE); Rainer Perthold, Weisendorf (DE)

(73) Assignee: Fraunhofer-Gesellschaft zur Förderung der angewandten Forshung e.V., (DE)

( * ) Notice: Subject to any disclaimer, the term of this patent is extended or adjusted under 35 U.S.C. 154(b) by 531 days.

(21) Appl. No.: 10/258,711

(22) PCT Filed: Apr. 19, 2001

(86) PCT No.: PCT/EP01/04477

§ 371 (c)(1),
(2), (4) Date: Jan. 13, 2003

(87) PCT Pub. No.: WO01/84703

PCT Pub. Date: Nov. 8, 2001

(65) Prior Publication Data

US 2004/0014437 A1    Jan. 22, 2004

(30) Foreign Application Priority Data

Apr. 28, 2000   (DE)   ............................... 100 20 930

(51) Int. Cl.
*H04B 1/04*    (2006.01)
(52) U.S. Cl. ............... 455/126; 455/114.2; 455/115.1; 455/127.1
(58) Field of Classification Search .............. 455/126, 455/127.1, 127.2, 114.2, 115.1, 115.2, 127.3, 455/127.4
See application file for complete search history.

(56) References Cited

U.S. PATENT DOCUMENTS

| 5,049,832 A | | 9/1991 | Cavers |
| 5,191,338 A | | 3/1993 | Katz et al. |
| 5,613,106 A | * | 3/1997 | Thurman et al. ......... 455/127.1 |
| 5,819,165 A | * | 10/1998 | Hulkko et al. ........... 455/115.3 |
| 5,923,712 A | * | 7/1999 | Leyendecker et al. ...... 455/126 |
| 6,072,364 A | | 6/2000 | Jeckeln et al. |
| 6,141,390 A | * | 10/2000 | Cova ......................... 455/126 |
| 6,307,444 B1 | | 10/2001 | Neumann et al. |
| 6,751,447 B1 | * | 6/2004 | Jin et al. ................. 455/114.3 |
| 6,823,169 B1 | * | 11/2004 | Marko et al. .............. 455/3.02 |
| 2004/0248526 A1 | * | 12/2004 | Narita et al. ............. 455/114.2 |
| 2005/0153677 A1 | * | 7/2005 | Vorenkamp et al. ..... 455/226.1 |

FOREIGN PATENT DOCUMENTS

| DE | 42 39 551 A1 | 6/1993 |
| DE | 42 40 609 A1 | 6/1994 |
| DE | 197 07 675 A1 | 8/1998 |
| DE | 199 27 952 A1 | 1/2001 |
| EP | 0 885 482 B1 | 12/1998 |

* cited by examiner

Primary Examiner—Lana Le
(74) Attorney, Agent, or Firm—Dougherty Clements

(57) ABSTRACT

A device for pretreating a signal to be transmitted over a transmission path, wherein the transmission path comprises a band-pass filter whose pass-band width is smaller than a predetermined bandwidth and a non-linear amplifier, includes a linearization means for performing a linearization of the signal to be transmitted before the transmission of the same, such that a non-linearity caused by the non-linear amplifier is counteracted. Further, the device includes a signal-shaping means downstream to the linearization means comprising a frequency response such that the overall frequency response of the signal-shaping means and the band-pass filter corresponds to the frequency response of a filter whose pass-band width is at least equal to the predetermined bandwidth.

4 Claims, 2 Drawing Sheets

DEVICE AND METHOD FOR PRE-TREATING A SIGNAL TO BE TRANSMITTED USING A NON-LINEAR AMPLIFIER WITH AN UPSTREAM BAND-PASS FILTER

BACKGROUND OF THE INVENTION

1. Field of the Invention

The present invention relates to a device and a method for pretreating a signal to be transferred using a non-linear amplifier which is subjected to a prelinearization and a predistortion, respectively, in order to counteract non-linearities introduced by the non-linear amplifier. In particular, the present invention relates to a device and a method for pretreating a signal which is to be transferred over a non-linear amplifier which has a preceding narrow-banded band-pass filter whose pass-band width is only slightly larger than the signal bandwidth to be processed.

2. Description of Prior Art

It is known to subject signals to a predistortion and prelinearization, respectively, which are to be transferred using a non-linear amplifier, for example using a non-linear amplifier which is arranged in a communication satellite, in order to counteract the non-linearities generated by the amplifier and completely compensate them in the optimum case, respectively. In the case of a satellite transmission system it is attempted to compensate distortions this way which occur in the output amplifier of the satellite, by a corresponding predistortion of the transmission signal in the ground station.

An exemplary method for generating a linearized amplifier output signal in which distortions generated by a non-linear amplifier are reduced and compensated, respectively, responding to a predistorted input signal is described in U.S. Pat. No. 5,049,832. In this method the amount square of the input signal is detected, wherein a table is accessed depending on the amount square in order to multiply the input signal with a predetermined complex coefficient in order to cause a predistortion of the input signal, such that the output signal amplified by the non-linear amplifier is linearized according to amount and phase. A means for comparing input signal and output signal is provided in order to perform an adjustment of the coefficients stored in the table.

An alternative method for performing a predistortion for a non-linear transmission link in the high-frequency range is known from EP 0885482 B1, wherein an envelope curve of an input signal is detected and quantized in the method described there, in order to generate quantized envelope curve values. On the basis of detected, quantized envelope curve values a table means is accessed in which complex predistortion coefficients are stored. The input signal is predistorted on the basis of the predistortion coefficients, such that the distortion introduced by the non-linear transmission link is basically compensated according to amount and phase.

A still further method for performing a predistortion and prelinearization, respectively, of a transmission signal to be transferred over a non-linear transmission link is disclosed in the not pre-published German Patent Application 19927952.7. In the method illustrated there an estimation signal is generated using a table in which complex coefficients are stored, at first depending on an input signal, wherein the estimation signal illustrates an estimation of an output signal amplified by a non-linear amplifier. A difference is formed from the estimation signal and the input signal illustrating an error signal illustrating the estimation of the error introduced by the non-linear amplifier. This error signal is time-expanded by a time-dispersive element and then subtracted from the input signal in order to perform a pre-linearization of the input signal, such that an error signal part in the frequency spectrum of the output signal is shifted away from the useable frequency range of the signal.

The above-mentioned predistortion and prelinearization methods, respectively, and all further predistortion methods of a plurality known in the art, wherein a predistortion and prelinearization, respectively, of a signal is executed before the transmission of the same by a non-linear amplifier, will fail when the bandwidth of a preceding channel filter to the non-linear amplifier lies essentially in the range of the signal bandwidth to be processed or amounts to less than three to five times the bandwidth of the undistorted signal, respectively.

SUMMARY OF THE INVENTION

It is the object of the present invention to provide a device and a method for pretreating a signal to be transmitted using a non-linear amplifier which also facilitate a sufficient pre-linearizing and predistortion, respectively, of the signal to be transmitted before its transmission when a narrow-band band-pass filter is preceding the non-linearized amplifier.

According to a first aspect of the invention this object is achieved by a device for pretreating a signal to be transmitted over a transmission path, wherein the transmission path is a band-pass filter whose pass-band width is less than a predetermined bandwidth and comprises a non-linear amplifier, comprising:

a linearization means for performing such a linearization of the signal to be transmitted before the transmission which counteracts a non-linearity caused by the non-linear amplifier; and a signal-shaping means downstream to the linearization means comprising such a frequency response that the overall frequency response of the signal-shaping means and the band-pass filter corresponds to the frequency response of a filter whose pass-band width is at least equal to the predetermined bandwidth.

According to a second aspect of the invention, this object is achieved by a method for transmitting a first signal over a transmission path comprising a band-pass filter whose pass-band width is smaller than a predetermined bandwidth and a non-linear amplifier, comprising the following steps:

performing such a linearization of a first signal that a non-linearity caused by the non-linear amplifier is compensated in order to generate a signal;

directing the second signal through a signal-shaping means comprising such a frequency response that the overall frequency response of the signal-shaping means and the band-pass filter corresponds to the frequency response of a filter whose pass-band width is at least equal to a predetermined bandwidth for generating a third signal; and transmitting the third signal over the transmission path.

The present invention is primarily based on the findings that with all known methods for pre-distorting and prelin-earizing, respectively, of signals to be transmitted over non-linear transmission links energy outside the useable band is added to the signals to be transmitted over the predistortion and prelinearization, respectively. This energy, however, is filtered and strongly reduced, respectively, by narrow-banded band-pass filters preceding the non-linear amplifier, so that the predistortion and prelinearization, respectively, can not cause the desired effect to reduce the non-linearity introduced by the non-linear amplifier and compensate it in the optimum case, respectively. In order to facilitate that this energy reaches the non-linear amplifier basically completely outside the useable band in order to cause a linearization of the output signal of the same, as desired, a signal-shaping means is provided according to the invention. The signal-shaping means comprises such a frequency response that the overall frequency response of a serial interconnection of the signal-shaping means and the band-pass filter downstream to the non-linear amplifier comprises such a pass-band width that apart from the signal parts in the useable band also the energy parts necessary for a linearization added by the predistortion and prelinearization, respectively, may reach the non-linear amplifier outside the useable band without an excessive attenuation.

If it is assumed that energy parts are introduced within a frequency band by the predistortion and prelinearization, respectively, which is approximately three times as wide as the useable bandwidth of the signal to be transferred, then the frequency response of the signal-shaping means is preferably selected such that the overall frequency response of the signal-shaping means and the band-pass filter corresponds to the frequency response of a filter whose pass-band width is at least three times as large as the signal bandwidth. Preferably, the frequency response of the signal-shaping means is set such that the overall frequency response of an interconnection of the signal-shaping means and the band-pass filter corresponds to the frequency response of a band-pass filter whose pass-band width corresponds to three to five times the signal bandwidth.

The invention may preferably be used in the area of satellite communication if conventional "transparent" transponders are used on the satellite whose output amplifiers cause non-linear distortions and which are equipped with a narrow-band band-pass filter preceding the output amplifier and whose bandwidth is only slightly larger than the signal bandwidth to be processed. The amplifiers in such communication transponders are usually travelling-wave tubes causing significant distortions.

By using conventional linearization methods the invention facilitates the linearization of the output amplifier of a satellite even if the channel filter preceding the same would not allow a linearization according to conventional methods. This is achieved by the inventive signal-shaping means being downstream to a conventional linearization means in the ground station. Thereby a significant reduction of spurious emission is reached by the output amplifier of the satellite which again allows a higher modulation and thereby a higher transmission power of the satellite.

BRIEF DESCRIPTION OF THE DRAWINGS

In the following, preferred embodiments of the present invention are described in more detail referring to the accompanying drawings, in which.

DESCRIPTION OF PREFERRED EMBODIMENTS OF THE INVENTION

Figure 1:
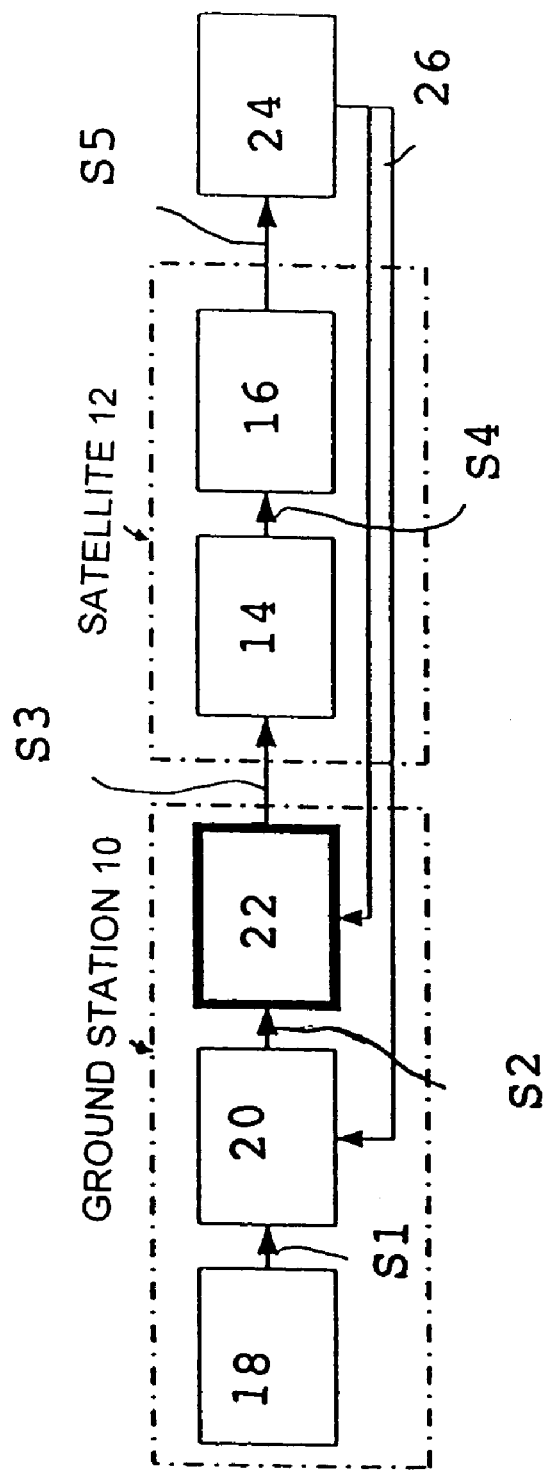
FIG. 1 shows a rough schematical illustration of a satellite transmission system wherein one embodiment of the present invention is implemented.

Referring to FIG. 1 an embodiment of the present invention is described in the following wherein it is used for a satellite transmission system.

In FIG. 1 a ground station 10 and a communication satellite 12 of a satellite transmission system are illustrated schematically. The inventive device for pretreating a signal to be transmitted over a transmission path is thereby implemented in the ground station 10 of the satellite transmission system.

Existing communication satellites 12, so-called "transparent" transponders, usually comprise a channel band-pass filter 14 which is preceding a non-linear amplifier 16. The bandwidth of the channel band-pass filter 14 is usually only slightly larger than the signal bandwidth of a signal to be transmitted before a predistortion and a prelinearization, respectively, of the same. The amplifier 16 of the transponder and the communication satellites 12, respectively, is usually a travelling wave tube causing significant distortions.

The ground station 10 includes a signal source 18 generating a signal S1 to be transmitted. At this point it is to be noted that in existing systems the pass-band width of the channel band-pass filter 14 in the communication satellite 12 is adjusted to the signal bandwidth of the input signal S1 and is slightly larger than the same, respectively.

A linearization means 20 is connected to the output of the signal source 18. The linearization means 20 may be a conventional linearization and predistortion means, respectively, as was described above referring to the prior art. The linearization means 20 generates a predistorted input signal S2 from the input signal S1. According to the invention, the output of the linearization means 20 is connected to a signal-shaping means which generates an overall frequency response together with the channel band-pass filter 14 in the communication satellite 12 comprising a bandwidth which is three times as large as the signal bandwidth of the input signal S1. The output signal S3 of the signal-shaping means 22 is then transmitted to the communication satellite 12, filtered through the channel band-pass filter 14 and directed to the output amplifier of the satellite 12 as the filtered signal S4.

As the overall frequency response of the combination of signal-shaping means 22 and channel band-pass filter 14 comprises a bandwidth which is at least three times as large as the signal bandwidth, energy which is added by the predistortion outside the useful band is not attenuated stronger by this overall frequency response than signal parts present in the useful band. Referring to the frequency response of the signal-shaping means 22 and the channel band-pass filter 14 as well as regarding the overall frequency response of an interconnection of these elements reference is made to the following description of FIG. 2.

An optional test receiver 24 which may be provided in the ground station 10 or separate from the same receives the output signal S5 of the communication satellite 12 and thereby facilitates to set the characteristic of the linearization means 20 and the signal-shaping means 22 optimally over a comparison of the input signal S1 to the output signal S5, as is schematically illustrated by the arrows 26 in FIG. 1. In particular, for example predistortion coefficients of the linearization means and coefficients of the signal-shaping means are for example set and adapted by this, respectively, in order to generate the desired frequency response.

Figure 2:
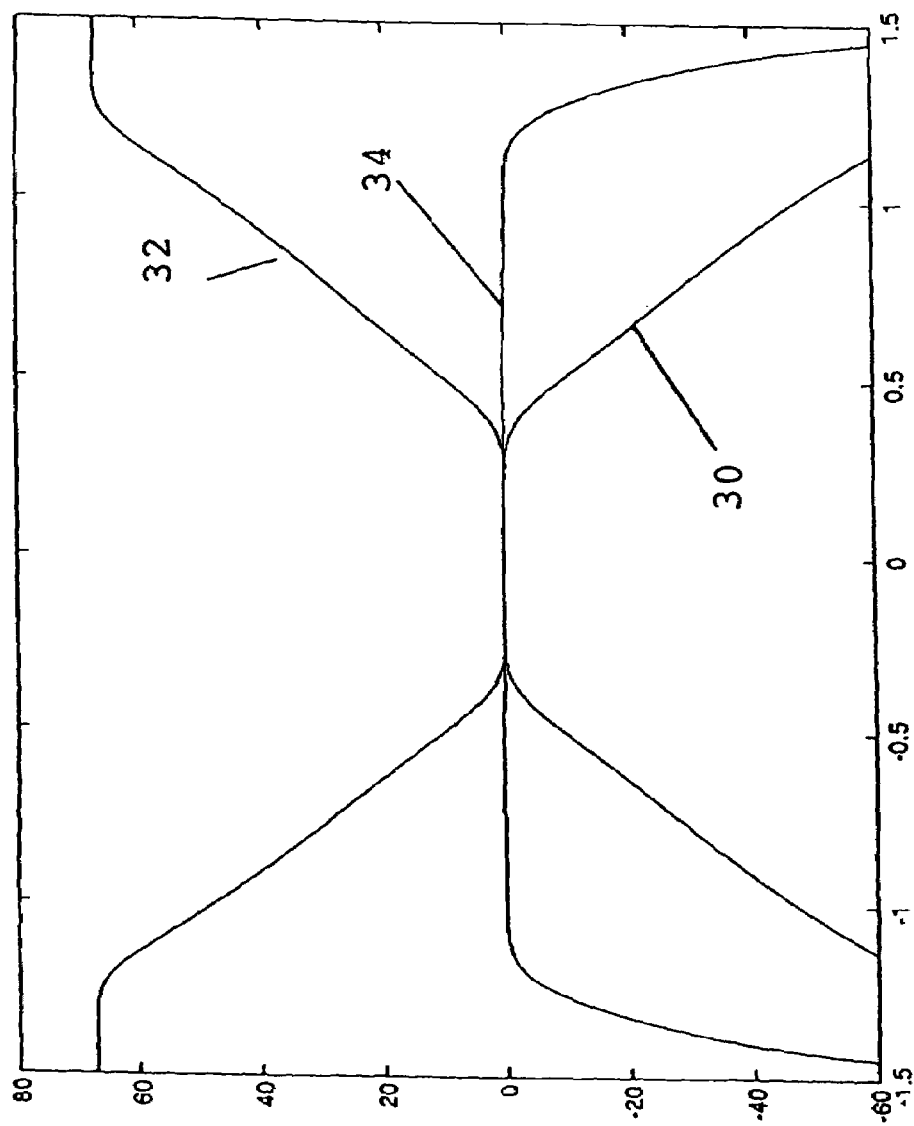
FIG. 2 shows a schematical diagram which shows the frequency responses for explaining the present invention.

In FIG. 2 a diagram of the frequency response 30 of the channel band-pass filter 14, the frequency response 32 of the signal-shaping means 22 and the overall frequency response 34 resulting from a series connection of the signal-shaping means 22 and the channel band-pass filter 30 are shown.

On the abscissa of FIG. 2 the standardized frequency is illustrated starting from a center frequency 0 of the signal bandwidth. On the ordinate of FIG. 2 standardized attenuation and amplification values are entered, respectively, wherein it is clear that the respective frequency, attenuation and amplification values actually present are dependent on the used frequency band and the used members, respectively.

Referring to FIG. 2 it is assumed that the pass-band width of a frequency response 30 of the channel band-pass filter 14 corresponds to the signal bandwidth of the input signal or is only slightly larger than the same, respectively. Due to such a low bandwidth of the channel band-pass filter 14 energy parts generated by the linearization means 20 outside the useful band would be filtered out, so that the linearization as desired may not be realized. Therefore, the signal-shaping means 22 is provided according to the invention, comprising a frequency response 32 which is generally "inverse" and "complementary", respectively, to the frequency response 30, such that a combination of the two frequency responses, i.e. an addition of the same, caused by a connection in series of the elements 22 and 14, generates an overall frequency response 34 with a pass-band width of at least three times the signal bandwidth. The signal-shaping means 22 may thereby also be referred to as an inverse band-pass filter.

In order to generate the frequency response 32 illustrated in FIG. 2 the signal-shaping means 22 may consist of a suitable amplifier circuit having an amplification complementary to the attenuation in the frequency ranges in which the channel band-pass filter 14 provides an attenuation. Thus, the overall frequency response 34 is generated, as it is shown in FIG. 2, comprising a pass-band width, wherein the energy outside the useful band added by the predistortion remains basically unattenuated or is not attenuated stronger than the signal within the useful band, respectively.

The present invention thus facilitates the use of known linearization methods also in the field of satellite communication using existing satellites, wherein a narrow-banded band-pass filter is preceding the output amplifier.

Finally, it is noted that the pass-band width of the overall frequency response generated by the signal-shaping means and the channel band-pass depends on the fact in which frequency ranges the prelinearization means generates energy parts which are necessary in order to generate a sufficiently linearized signal at the output of the amplifier. In conventional predistortion methods it is usually sufficient to set the pass-band width of the overall frequency band to three to five times the signal bandwidth. Depending on the predistortion used also a less wide pass-band width of the overall frequency response may suffice, however, or a broader overall pass-band width may be needed, respectively.

What is claimed is:

1. A device for pretreating a signal (S1) to be transmitted over a transmission path, wherein the transmission path comprises a band-pass filter (14) whose pass-band width (30) is smaller than a predetermined bandwidth and a non-linear amplifier (16), comprising:
   linearization means (20) for performing such a linearization of the signal (S1) to be transmitted before the transmission of the same, that a non-linearity caused by the non-linear amplifier (16) is counteracted;
   a signal shaping means (22) downstream to the linearization means (20) comprising such a frequency response (32) that the overall frequency response (34) of the signal-shaping means (22) and the band-pass filter (14) corresponds to the frequency response of a filter whose pass-band width is at least equal to the predetermined bandwidth wherein the linearizer and the signal-shaping means are arranged in the ground station of a satellite transmission system and wherein the band-pass filter and the non-linear amplifier are arranged in a satellite of the satellite transmission system.

2. The device according to claim 1, wherein the predetermined bandwidth corresponds to three times the signal bandwidth of the signal (S1) to be transmitted.

3. The device according to claim 1, further comprising a receiver for receiving a signal to be transmitted over the transmission path and a means for setting coefficients of the linearization means and/or the signal-shaping means based on the received transmitted signal and the signal to be transmitted.

4. A method for transmitting a first signal over a transmission path comprising a band-pass filter whose pass-band width is less than a predetermined bandwidth, and a non-linear amplifier, comprising the following steps:
   performing such a linearization of the first signal that a non-linearity caused by the non-linear amplifier is compensated for, in order to generate a second signal;
   directing the second signal through a signal shaper comprising such a frequency response that the overall frequency response of the signal shaper and the band-pass filter corresponds to the frequency response of a filter whose pass-band width is at least equal to the predetermined bandwidth, in order to generate a third signal; and
   transmitting the third signal over the transmission path wherein the linearization and the signal-shaping means are arranged in the ground station of a satellite transmission system and wherein the band-pass filter and the non-linear amplifier are arranged in a satellite of the satellite transmission system.

* * * * *